United States Patent
Hong et al.

(10) Patent No.: US 7,045,841 B2
(45) Date of Patent: May 16, 2006

(54) OXIDATION STRUCTURE/METHOD TO FABRICATE A HIGH-PERFORMANCE MAGNETIC TUNNELING JUNCTION MRAM

(75) Inventors: Cheng T. Hong, San Jose, CA (US); Ru-Ying Tong, San Jose, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 0 days.

(21) Appl. No.: 11/268,352

(22) Filed: Nov. 7, 2005

(65) Prior Publication Data
US 2006/0057745 A1 Mar. 16, 2006

Related U.S. Application Data

(62) Division of application No. 10/820,391, filed on Apr. 8, 2004, now Pat. No. 6,974,708.

(51) Int. Cl.
*H01L 29/76* (2006.01)

(52) U.S. Cl. .................. 257/295; 257/296; 257/421

(58) Field of Classification Search ........ 257/295–296, 257/421–422
See application file for complete search history.

(56) References Cited

U.S. PATENT DOCUMENTS

| | | | |
|---|---|---|---|
| 5,640,343 A | 6/1997 | Gallagher et al. | 365/171 |
| 6,331,944 B1 | 12/2001 | Monsma et al. | 365/171 |
| 6,703,654 B1 | 3/2004 | Horng et al. | 257/295 |
| 6,864,175 B1* | 3/2005 | Engelhardt et al. | 438/691 |
| 6,960,480 B1 | 11/2005 | Horng et al. | 438/3 |
| 2002/0081753 A1 | 6/2002 | Gates et al. | 438/3 |
| 2005/0057863 A1 | 3/2005 | Horng et al. | 360/324.1 |
| 2005/0170532 A1 | 8/2005 | Horng et al. | 438/3 |

OTHER PUBLICATIONS

"Growth Mechanisms of Thin Insulating Layer in Ferromagnetic Tunnel Junctions Prepared Using Various Oxidation Methods", by Y. Ande et al, J. Phys. D. : Appl. Phys., vol. 35, pp. 2415-2421 (2002).

"Magnetic Tunnel Junctions With a Tunnel Barrier Formed by $N_2O$ Plasma", by Heejae Shim et al., Appl. Phys. Lett., vol. 83, No. 22, pp. 4583-4585, Dec. 1, 2003.

(Continued)

*Primary Examiner*—H. Jey Tsai
(74) *Attorney, Agent, or Firm*—George O. Saile; Stephen A. Ackerman

(57) ABSTRACT

An MTJ (magnetic tunneling junction) MRAM (magnetic random access memory) has a tunneling barrier layer of substantially uniform and homogeneous $Al_2O_3$ stoichiometry. The barrier layer is formed by depositing Al on a CoFe layer or a CoFe—NiFe bilayer having an oxygen surfactant layer formed thereon, then oxidizing the Al by radical oxidation. The underlying surfactant layer contributes oxygen to the bottom surface of the Al, forming an initial amorphous $Al_2O_3$ layer. This layer produces small, uniform grains in the remaining Al layer, which promotes a uniform oxidation of the Al between its upper and lower surfaces by the subsequent radical oxidation. A final annealing process to set a pinned layer magnetization enhances the homogeneous oxidation of the layer.

13 Claims, 2 Drawing Sheets

OTHER PUBLICATIONS

"Oxygen as a Surfactant in the Growth of Giant Magneto-Resistance Spine Valves," by W. F. Egelhoff, Jr. Jrnl. of Applied Physics, vol. 82, No. 12, Dec. 15 1997, pp. 6142-6151.

"Progress and Outlook for MRAM Technology", by S. Tehrani et al., IEEE Trans. on Magnetics, vol. 35, No. 5, Sep. 1999, pp. 2814-2819.

"Exchange-Biased Magnetic Tunnel Junctions and Application to Nonvolatile Magnetic Random Access Memory (Invited)," by S.S. Parkin et al., Jrnl. of Applied Phys., vol. 85, No. 8, Apr. 15, 1999, pp. 5828-5833.

"Magnetoresistance of Co100-xFex/Al-Oxide/Co100-xFex Tunnel Junctions," by Eiji Nakashio et al., IEEE Trans. on Mag., vol. 36, No. 5, Sep. 2000, pp. 2812-2814.

"Fundamantals of Magnetic Tunnel Junctions", by J. Fujikata et al., Jrnl. of Appl. Phys., vol. 89, No. 11, Jun. 1, 2001, pp. 7558-7560.

U.S. Appl. No. HT-03-022, U.S. Appl. No. 10/844,171, filed May. 12, 2004, "A Novel Structure/Method to Fabricate a High-Performance Magnetic Tunneling Junction MRAM", Assigned to the Same Assignee as the Present Invention.

* cited by examiner

OXIDATION STRUCTURE/METHOD TO FABRICATE A HIGH-PERFORMANCE MAGNETIC TUNNELING JUNCTION MRAM

This is a division of patent application Ser. No. 10/820, 391, filing date Apr. 8, 2004 now U.S. Pat. No. 6,974,708, A Novel Oxidation Structure/Method TO Fabricate A High-Performance Magnetic Tunneling Junction MRAM, assigned to the same assignee as the present invention, which is herein incorporated by reference in its entirety.

RELATED PATENT APPLICATION

This application is related to Ser No. 10/371,841, filing date Feb. 10, 2003 and Ser. No. 10/768,917, filing date Jan. 30, 2004, Ser. No. 10/661,038 filing date Aug. 12, 2003, Ser. No. 10/844,171, filing date May 12, 2004, and Ser. No. 10/849,310, filing date May 19, 2004, assigned to the same assignee as the current invention.

BACKGROUND OF THE INVENTION

1. Field of the Invention

This invention relates generally to magnetic tunneling junction (MTJ) MRAMs and more particularly to the use of an oxidation process that leads to a smooth bottom electrode and resulting superior performance properties.

2. Description of the Related Art

The magnetic tunneling junction device (MTJ device) is essentially a variable resistor in which the relative orientation of magnetic fields in an upper and lower magnetized electrode controls the flow of spin-polarized tunneling electrons through a very thin dielectric layer (the tunneling barrier layer) formed between those electrodes. As electrons pass through the lower electrode they are spin polarized by its magnetization direction. The probability of an electron tunneling through the intervening tunneling barrier layer then depends on the magnetization direction of the upper electrode. Because the tunneling probability is spin dependent, the current depends upon the relative orientation of the magnetizations of magnetic layers above and below the barrier layer. Most advantageously, one of the two magnetic layers (the pinned layer) in the MTJ has its magnetization fixed in direction, while the other layer (the free layer) has its magnetization free to move in response to an external stimulus. If the magnetization of the free layer is allowed to move continuously, as when it is acted on by a continuously varying external magnetic field, the device acts as a variable resistor and it can be used as a read-head. If the magnetization of the free layer is restricted to only two orientations relative to the fixed layer (parallel and anti-parallel), the first of which produces a low resistance (high tunneling probability) and the second of which produces a high resistance (low tunneling probability), then the device behaves as a switch, and it can be used for data storage and retrieval (a MRAM).

Magnetic tunneling junction devices are now being utilized as information storage elements in magnetic random access memories (MRAMs). Gallagher et al. (U.S. Pat. No. 5,640,343) discloses an array of MTJ elements connected to a diode in series, the whole comprising an MRAM array. The individual MTJ elements are substantially formed as described briefly above. As is further disclosed by Gallagher, when used as an information storage or memory device, a writing current (or currents) orients the magnetization of the free layer so that it is either parallel (low resistance) or anti-parallel (high resistance) to the pinned layer. The low resistance state can be associated with a binary 0 and the high resistance state with a binary 1. At a later time a sensing current passed through the MTJ indicates if it is in a high or low resistance state, which is an indication of whether its magnetizations are, respectively, antiparallel or parallel and whether it is in a 0 or 1 state. Typically, switching the magnetization direction of the free layer from parallel to antiparallel and vice-versa is accomplished by supply currents to orthogonal conductor lines, one which is above the MRAM cell and one which is below it. The line above the cell is referred to as the "digit" or "word" line and is electrically isolated from the cell by intervening dielectric material. The line below the cell, called the "bit" line, is in electrical contact with the top of the cell and is used for both writing (changing free layer magnetization) and reading (detecting high or low resistance). The word line is oriented so that its magnetic field is along the hard axis of the free layer. The bit line provides the component of the switching field parallel to the easy axis of the free layer. The two lines intersect orthogonally with the cell lying between them so that the combined field peaks just above the switching threshold of the cell (field required for a transition from parallel to antiparallel, or vice versa, relative orientations of the free and pinned layer magnetizations). For fast operation of the cell, it must have a high magnetoresistance ratio (DR/R), where DR represents the resistance variation when the free layer magnetization switches direction and R represents the total minimum resistance of the cell when free and pinned layers are magnetized in parallel directions. For stable operation, the cell's junction resistance, RA, where A is cell cross-sectional area, must be well controlled. When the MRAM device is used as the basic element of a memory, it is replicated to form an array of many such devices and integrated with associated CMOS circuitry which accesses particular elements for data storage and retrieval.

When fabricating an MRAM element or an array of such elements, the necessity of creating a high value of DR/R and maintaining a high degree of control over the junction resistance requires the formation of thin, smooth layers of high quality.

In a standard MRAM array structure the MTJ stack (lower electrode/AlOx tunneling barrier/upper electrode) is deposited on top of the bottom conductor (the bit line), which is a tri-layer such as Ta/Cu/Ta or NiCr/Ru/Ta. The lower electrode is a magnetically pinned layer, the upper electrode is a magnetically free layer and the tunneling barrier layer is a layer of oxidized aluminum. Great efforts have been made in trying to control the oxidation of the aluminum when forming the barrier layer. Typically, the Al layer is formed on the bottom electrode by physical vapor deposition (PVD). This form of deposition produces a thin layer of polycrystalline aluminum. Depending on the thickness of the aluminum layer, different forms of oxidation have been used. For example, natural oxidation (NOX), plasma oxidation and radical oxygen oxidation (ROX) have all been used to produce the barrier layer and will be discussed further below.

A typical tunneling barrier layer for an MRAM device is made by in-situ oxidation of a 7 to 10 angstrom thick Al layer and the resulting oxidized layer has a junction resistance, RA, in the kilo-ohm-micron$^2$ (k$\Omega\mu m^2$) range. When the oxidation method used is plasma oxidation, the energetic oxygen plasma ions may damage the underlying ferromagnetic material of the lower (pinned) electrode. Therefore, radical oxidation (ROX) is normally used for the oxidation method. ROX is achieved by covering the plasma with a grounded metal mesh "shower cap," so that only the oxygen radical and neutral oxygen can reach the substrate. In the initial stage of ROX, oxygen covers the aluminum grain surface homogeneously and the resulting oxidized structure is amorphous. Oxidation starts at the Al surface and forms a good $Al_2O_3$ stoichiometry. The oxidation process then moves progressively downward to the interface between the deposited aluminum layer and the underlying electrode surface. It is known that oxygen diffusion proceeds much more rapidly along the grain boundary than into the grain itself. Consequently, the oxygen diffusion front does not proceed at a uniform rate or with a uniform spatial dependence through the deposited aluminum layer. A discussion of several oxidation methods can be found in Y. Ando et al., "Growth mechanisms of thin insulating layer in ferromagnetic tunnel junctions prepared using various oxidation methods," J. Phys. D.: Appl. Phys., Vol. 35, 2415–2421, (2002).

When the Al layer is "under-oxidized," meaning that the portion of the layer closest to the interface with the bottom electrode has an oxide stoichiometry of the form $Al_2Ox$, with x<3, as is the case in NOX (without the assist of a plasma), the product RA is low, and so are the layer breakdown voltage and the GMR ratio, DR/R. When the layer is "over-oxidized," meaning that oxygen has diffused into the lower electrode, the product RA is greatly increased, but DR/R is decreased. The use of plasma oxidation to produce oxidized layers is discussed in Heejae Shim et al., "Magnetic tunnel junctions with a tunnel barrier formed by $N_2O$ plasma," Appl. Phys. Lett., Vol. 83, No. 22, p. 4583, 1 Dec. 2003.

After the MRAM film stack is formed (the multi-layered lamination of layers before patterning), it is thermally annealed to fix the magnetiization direction of the pinned ferromagnetic layer (the lower electrode). Annealing improves the homogeneity of the oxidized aluminum layer by redistributing the oxygen in the barrier layer and by driving out the oxygen from the pinned layer. It is found that the thermal annealing process improves the integrity of the barrier layer (eg. it raises the breakdown voltage) and enhances the DR/R ratio.

In order to obtain a high DR/R, the ferromagnetic layers adjacent to the barrier layer are formed of CoFe. It has been reported that CoFe with 25% Fe by number of atoms yields a higher DR/R than CoFe with 10% Fe by number of atoms. This is due to the fact that the CoFe(25%) produces a higher degree of spin polarization of conduction electrons at the CoFe/$Al_2Ox$ interface. Experiments have also shown that an electrode formed of NiFe(60%) also gives a high DR/R and, in addition, because the binding energy between Fe and O is weaker than that of Co and O, the annealing process drives oxygen out of a NiFe electrode more readily than a CoFe electrode.

In the fabrication of MTJ MRAM devices it would be highly desirable to form an $Al_2O_x$ tunneling barrier layer that is flat and smooth and has an $Al_2O_3$ stoichiometry at its upper and lower interfaces with the electrodes. In this case, the spin polarization would be symmetrical at both interfaces, yielding both a high DR/R and breakdown voltage.

The present invention discloses a novel oxidation technique for forming an improved $Al_2O_x$ barrier layer. The invention is to do the oxidation from both sides of the deposited Al layer, so that the $Al_2O_3$ stoichiometry is ultimately more uniformly achieved within the entire body of the layer. The method that is proposed to produce this symmetrical oxidation process is to form an oxygen surfactant layer (OSL) on the surface of the CoFe(25%) or NiFe(60%) pinned layer, so that there is a source of oxygen for the bottom surface of the deposited Al layer. An oxygen surfactant layer, which is discussed in related Applications HT 02-032and HT 03-006, both of which are fully incorporated herein by reference, is a sub-monolayer of oxygen adsorbed on the surface of a deposited layer. When the Al layer is then subjected to a ROX process, the plasma supplies oxygen to the exposed Al surface, while the surfactant layer supplies it to the "hidden" surface. It is noted that reactivity of oxygen is stronger with Al than with CoFe, so the oxygen in the OSL will diffuse into the Al layer to form a CoFe/$Al_2O_3$ interface.

SUMMARY OF THE INVENTION

A first object of this invention is to provide a method of forming an MTJ MRAM element and an array of such elements, that are characterized by a smooth, flat tunneling barrier layer formed between the bottom and top electrodes.

A second object of this invention is to provide such a method that also produces an MTJ MRAM element and array of such elements that are characterized by a high DR/R ratio and a high breakdown voltage of the tunneling barrier layer.

A third object of the present invention is to provide the MTJ MRAM element and array of such elements that are produced by the method.

The objects of the present invention will be achieved by the fabrication of an MRAM element wherein the tunneling barrier layer is an oxidized aluminum layer having a uniform $Al_2O_3$ stoichiometry. The uniform stoichiometry is achieved by subjecting the as-deposited Al layer, which is deposited by physical vapor deposition (PVD) to an in-diffusion of oxygen from both its interface with the bottom electrode on which it has been deposited and its exposed upper surface. The source of oxygen from the bottom electrode is an oxygen surfactant layer (OSL), which is a monolayer of oxygen adsorbed on the upper surface of the bottom electrode. In accord with the method of this invention, the bottom electrode is a pinned ferromagnetic layer of either CoFe(25%) alone, or a bi-layer of CoFe(10%)—NiFe(60%). Because of the relative reactivities of Fe and Al with oxygen, either of these ferromagnetic layers have the property of being able to release oxygen atoms adsorbed on their surface to newly arriving Al atoms being deposited by the PVD process.

In order to achieve the full advantages of the present method, it was necessary to demonstrate, experimentally, the role of an oxygen surfactant layer (OSL) as a source of oxygen during the deposition of an Al layer. A simple multi-layer structure was used to test the basic invention idea. The test structure is:

Ta50/Ru10/CoFe(25%)30/OSL/NiCr50.

In the structure above, the Ta 50/Ru 10/CoFe(25%) 30 is a bottom electrode (the numbers representing thicknesses in angstroms), the Ta/Ru being a conducting lead layer and the CoFe being the ferromagnetic pinned layer. Of course, the actual pinning structure is not present, since the CoFe is only being tested for its ability to release oxygen from the surfactant layer, which is represented as "OSL" above.

To form the structure above, the Ta/Ru/CoFe electrode is first sputtered in a PVD module. The sputtered formation is then transferred to an "oxidation" chamber, which in the present experiment is a low pressure, commercially available Anelva 7100 system. The oxidation source in the chamber is very low pressure oxygen gas, specifically oxygen at a pressure of approximately 2×10$^{-7}$ torr, which is fed into the chamber at 0.02 sccm.

As can be seen from the table below, we exposed the CoFe layer to four different oxygen flow rates (0 sccm, 0.02 sccm, 0.04 sccm and 0.30 sccm) and corresponding exposure times (0.0 sec, 300 sec, 300 sec and 30 sec). The resulting CoFe layer was tested for its saturation magnetization, Bs, its coercivity, Hc, and for the change in Bs produced by the treatment.

| Flow Rate | Exposure time | B$_s$ | H$_c$ (Oe) | B$_s$ change |
|---|---|---|---|---|
| 0.0 (no oxygen) | 0.0 | 0.5391 | 13.21 | 0.00% |
| 0.02 sccm | 300 sec | 0.5591 | 10.59 | 3.71% |
| 0.04 sccm | 300 sec | 0.5616 | 10.45 | 4.27% |
| 0.30 sccm | 30 sec | 0.5014 | 13.99 | −6.98% |

Because the oxygen source provided by the OSL readily reacts with Al atoms being deposited on the OSL, the Al$_2$O$_3$ begins to form immediately. As the initial layer of Al$_2$O$_3$ is amorphous, the epitaxial growth of the Al on the CoFe is interrupted (ie. it has no crystalline sublayer to promote large grain growth). As a result, the remaining Al layer is flat and smooth because whatever crystal grains grow are very small. The OSL can also be formed by sputtering the CoFe (or whatever ferromagnetic layer is used) using an oxygen doped argon gas. HT 03-006, cited above and fully incorporated herein by reference, discloses the use of oxygen doped argon gas in sputter deposition of Cu spacer layers in the formation of GMR read sensors. It has been found that the small amount of oxygen that is incorporated within the sputtered layer is highly mobile and diffuses to the layer surface to form the OSL.

Once it is established that the OSL provides the oxygen needed to produce the desired high quality tunneling barrier layer, two advantageous multilayered stack configurations within which to apply the method are found to be the following:

(A)

BL/SE/NiCr/MnPt/CoFe(10%)/Ru/CoFe(25%)/OSL/Al/ROX/CoFe(25%)—NiFe(20%)/Ta (B)

BL/SE/NiCr/MnPt/CoFe(10%)/Ru/CoFe(10%)—NiFe(60%)/OSL/Al/ROX/NiFe(60%)—NiFe(20%)/Ta

In both (A) and (B), BL stands for "bottom lead," SE stands for "sputter etching," OSL stands for "oxygen surfactant layer" and ROX stands for "radical oxidation." The mild ROX process applied to oxidize the upper surface of the Al layer also enhances the overall homogeneity and stoichiometry of the barrier layer, making the interfacial regions particularly high quality. It is further noted that stack (A) includes a CoFe(25%) layer on which the OSL is formed, while stack (B) includes a composite CoFe(10%)—NiFe(60%) layer on which the OSL is formed.

After the stack configurations are formed, they are annealed for approximately 5 hours in a 10 kOe (kilo-Oersted) magnetic field to set the pinning fields. This annealing process further homogenizes the oxygen in the barrier layer to improve its integrity. In this regard, the smaller grain size already produced in the Al layer as a result of the OSL enhances the homogenization process of the anneal.

DESCRIPTION OF THE PREFERRED EMBODIMENTS

Figure 1A:
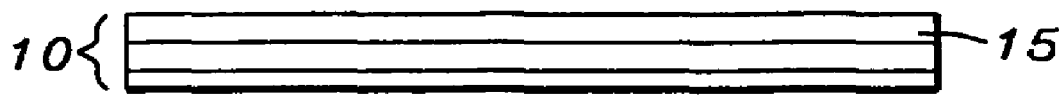
FIGS. 1a–e are schematic cross-sectional views of the formation of an MTJ MRAM element using the method and configuration of the present invention.

Referring first to FIG. 1a, there is seen in a schematic cross section an initial stage of a preferred embodiment of the invention, the formation of a single MRAM element, which can be a part of an array of such elements. It is to be understood that in the embodiments to be disclosed in what follows, all layer depositions take place in a high vacuum PVD chamber suitable for depositing thin layers by sputtering and oxidation processes take place in a separate plasma oxidation chamber. In these embodiments the system was a commercially available Anelva 7100 system which includes both such chambers, but other comparable systems are also suitable.

There is shown first a substrate (10), which in this embodiment is a lower conducting lead (the bit line, for example) on which the MRAM element will be formed. It is further understood that the single MRAM element can be one of an array of such elements and that such element or array may be further connected to associated circuitry used in storing and retrieving information.

The conducting lead layer (10) is typically a multilayer formation such as Ta/Ru/Ta and it is found that by subjecting the second Ta layer (15) (a capping layer), originally formed to a thickness between approximately 80 and 100 angstroms, with a sputter-etching (SE) process which removes approximately 20 to 30 angstroms of that Ta layer, subsequently formed layers are smoother and more uniform. This smoothness-promoting property of the sputter-etched layer is disclosed in related Application HT 03-022, which is fully incorporated herein by reference.

Figure 1B:
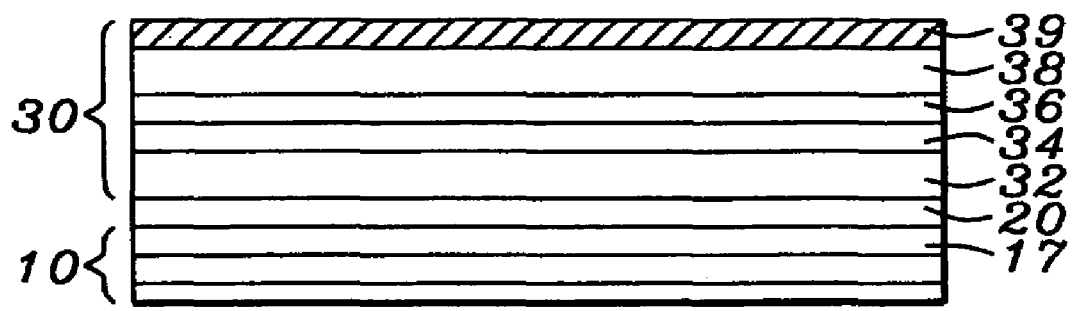

Referring to FIG. 1b, there is shown a NiCr seed layer (20) is then formed on the sputter-etched Ta layer surface, that thinner Ta layer now denoted (17). The seed layer further enhances smooth layer overgrowth as is set forth in related Application HT 03-025, fully incorporated herein by reference. A bottom electrode (30) is then formed on the seed layer, which in this embodiment is an antiferromagnetic pinning layer (32), which is preferably a layer of MnPt formed to a thickness between approximately 100 and 200 angstroms, on which is formed a synthetic antiferromagnetic pinned (SyAP) tri-layer structure comprising a lower ferromagnetic layer (34), a coupling layer (36) and an upper ferromagnetic layer (38), the two ferromagnetic layers subsequently being magnetized in antiparallel directions in the annealing process already discussed. The lower ferromagnetic layer is a layer of CoFe(10%) formed to a thickness between approximately 15 and 25 angstroms with 25 angstroms being preferred. On this layer is formed a thin coupling layer (36) of Ru, which is formed to a thickness between approximately 7 and 8 angstroms with 7.5 angstroms being preferred. On the coupling layer is formed the upper ferromagnetic layer (38) of CoFe (25%) with a thickness between approximately 15 and 20 angstroms. The 25% by atom number of Fe in this layer of CoFe is found to produce a particularly good value of DR/R. Alternatively, the upper ferromagnetic layer can be a composite layer of CoFe(10%)—NiFe(60%) (NiFe over CoFe), which is formed to a thickness between approximately 5 and 10 angstroms to produce an effective magnetic thickness (product of magnetic moment and thickness) equivalent to 15 to 20 angstroms of CoFe(25%). On the upper ferromagnetic layer (38), of either form, there is then formed the OSL (39) which is an essential part of the present invention. The OSL can be formed within an oxidation chamber after the upper layer of CoFe or CoFe—NiFe is formed or, as previously discussed, the OSL can be formed integrally with the upper layer by sputtering the layer using argon admixed with a small amount of oxygen. If the OSL is formed in an oxidation chamber, the oxygen source should preferably be present at very low pressure of approximately $2 \times 10^{-7}$ torr and should be maintained by an oxygen inflow of between approximately 0.02 and 0.04 sccm for a time of approximately 300 sec. The resulting OSL is less than a monolayer of oxygen.

If the OSL is to be formed as the CoFe or CoFe—NiFe layer is deposited, either layer can be sputter-deposited using a mixture of argon and oxygen in a manner set forth in detail in related Application HT 03-006.

Figure 1C:
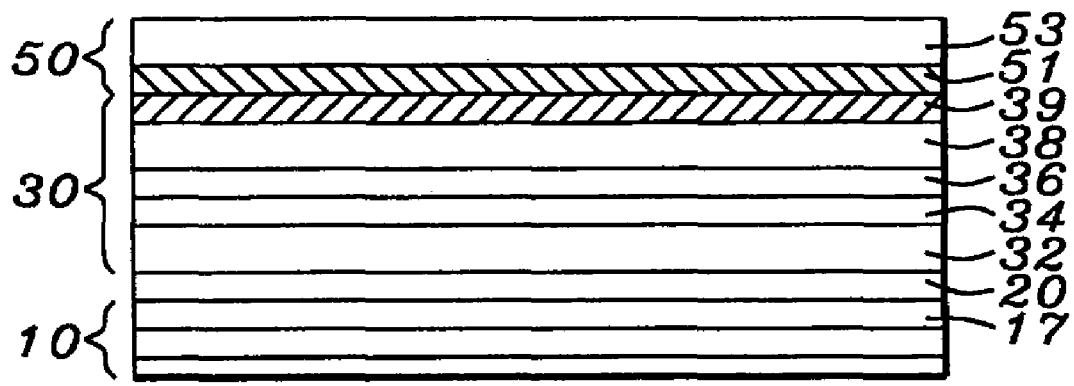

Referring now to FIG. 1c, there is shown the formation of a thin, flat and smooth tunneling barrier layer (50) of homogeneous $Al_2O_3$ stoichiometry on the pinned layer. First, an Al layer between approximately 7 and 10 angstroms thickness with approximately 9 angstroms being preferred is formed on the OSL of the CoFe(25%) layer (38). As this layer is first being deposited, oxygen atoms from the OSL (39) are being adsorbed by the Al atoms and are forming a very thin amorphous interfacial region (51) of substantially stoichiometric $Al_2O_3$. As the deposition continues, the oxygen from the OSL becomes exhausted and the remaining Al layer (53) is formed of small grained crystalline regions because the amorphous nature of the $Al_2O_3$ interfacial region (51) prevents the formation of large Al grains.

Figure 1D:
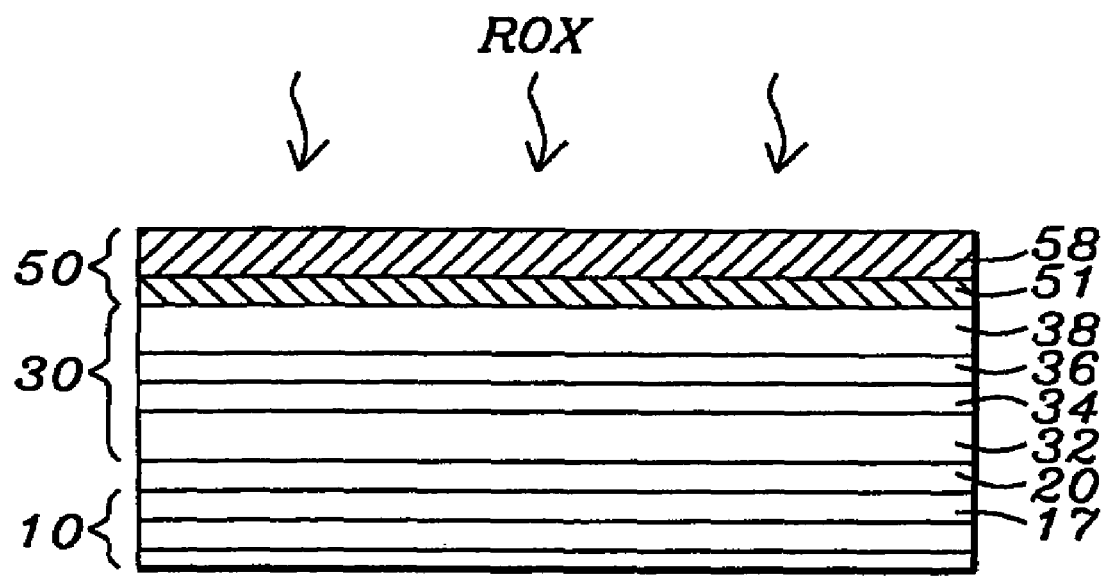

Referring next to FIG. 1d, there is shown the Al layer being subjected to a radical oxidation (ROX), which is oxidation by a shower of oxygen radicals, atoms and plasma generated ions in a separate plasma chamber. This oxidation process causes the upper small grained Al layer ((53) in FIG. 1c) to become oxidized with a good $Al_2O_3$ stoichiometry which extends inward to the $Al_2O_3$ layer (51) produced by adsorption of the OSL. This ROX layer is now denoted (58). The complete Al layer (50) is now substantially uniformly and homogeneously oxidized. The OSL (39) is gone, having contributed its oxygen content to the Al layer. The ROX process will not be discussed herein in detail since it is discussed in the paper by Y. Ando cited above and functionally provided by the operation of a plasma chamber within the Anelva unit discussed above. Briefly, the ROX process as applied to achieve the objects of the present invention is a plasma oxidation process carried out within a plasma oxidation chamber wherein a grid-like cap is placed between an upper electrode and the wafer surface being oxidized. Oxygen gas is then fed to the upper electrode and power is supplied to the electrode to at least partially ionize the gas. Passage through the cap renders the oxygen atoms, molecules, radicals and ions produced by the electrode less energetic when they arrive at the wafer surface. Within the plasma chamber used herein, an upper electrode within the chamber is fed with 0.5 liters of oxygen gas to produce a shower of oxygen radicals. Power is supplied to the electrode at a rate of 500 to 800 watts.

Figure 1E:
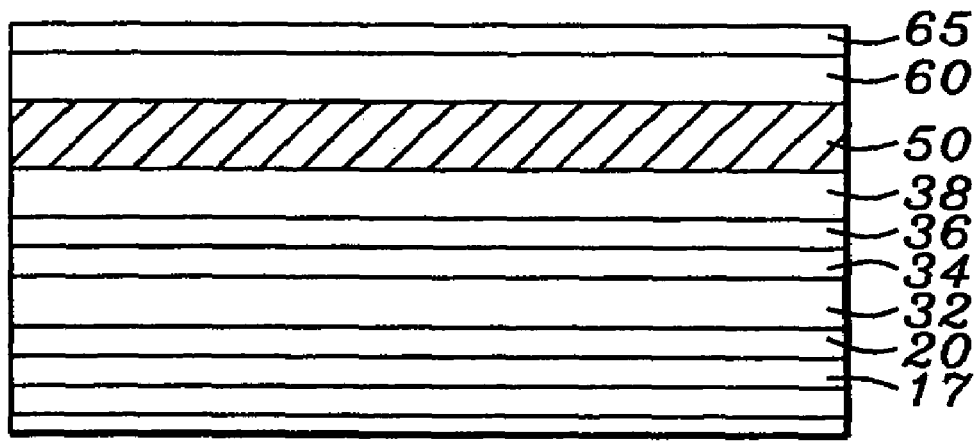

Referring now to FIG. 1e, there is seen the formation of FIG. 1c now having been returned to the PVD chamber for the deposition of the free layer (60) on the homogeneously oxidized barrier layer (50). The free layer is preferably a bilayer of NiFe (60%)—NiFe(20%) in which the first NiFe layer is formed to a thickness between approximately 5 and 10 angstroms with 10 angstroms being preferred and the second NiFe layer is formed to a thickness between approximately 25 and 50 angstroms with 30 angstroms being preferred, or a bilayer of CoFe(25%)—NiFe(20%) with the CoFe being between approximately 5 and 10 angstroms with 10 angstroms being preferred and the NiFe being between approximately 25 and 50 angstroms with 30 angstroms being preferred. A capping layer (65) of Ta, formed to a thickness between approximately 150 and 300 angstroms is then formed on the free layer. Although it is not represented in the figures, there is then an anneal to set the pinned layer magnetization directions, carried out at approximately 280° C., for approximately 5 hours in an external magnetic field of approximately 10 kOe. The lengthy high temperature processing serves to further homogenize the oxidation of the barrier layer (50), which is further enhanced by the small Al grain size resulting from the underlying OSL. The layer (50) is, therefore, shown uniformly shaded.

As is understood by a person skilled in the art, the preferred embodiments of the present invention are illustrative of the present invention rather than limiting of the present invention. Revisions and modifications may be made to methods, materials, structures and dimensions employed in forming and providing an MTJ MRAM device in which a tunneling barrier layer of uniform and homogeneous $Al_2O_3$ stoichiometry is formed by radical oxidation of an Al layer deposited on a lower electrode having an oxygen surfactant layer, while still forming and providing such a device and its method of formation in accord with the spirit and scope of the present invention as defined by the appended claims.

What is claimed is:

1. A magnetic tunneling junction (MTJ) device in an MRAM configuration comprising:
    a substrate;
    a conducting lead layer formed on said substrate, the layer including a Ta capping layer having a sputter-etched upper surface;
    an NiCr seed layer formed on said sputter-etched upper surface;
    a bottom electrode formed on said seed layer, said bottom electrode further comprising:
        a pinning layer of antiferromagnetic material;
        an SyAP pinned layer formed on said pinning layer, said SyAP layer including lower and upper ferromagnetic layers magnetized in antiparallel directions, said upper and lower layers separated by a coupling layer;
    an oxygen surfactant layer having been formed on said upper ferromagnetic layer;
    a smooth, stoichiometrically homogeneous, tunneling barrier layer of oxidized aluminum having uniformly small grain size, formed on said oxygen surfactant layer and having absorbed the oxygen thereof;
    a ferromagnetic free layer formed on said barrier layer;
    a capping layer formed on said ferromagnetic free layer.

2. The device of claim 1 wherein said NiCr seed layer is formed of NiCr with there being between approximately 35%–45% Cr by number of atoms.

3. The device of claim 1 wherein the antiferromagnetic pinning layer is a layer of MnPt formed to a thickness of between approximately 100 and 200 angstroms or a layer of IrMn formed to a thickness between approximately 50 and 100 angstroms.

4. The device of claim 1 wherein the SyAP layer comprises a lower and upper layer of CoFe separated by a coupling layer of Ru, wherein at least the upper layer of CoFe, which is adjacent to the tunnel barrier layer, is CoFe(25%).

5. The device of claim 1 wherein the SyAP layer comprises a lower layer of CoFe and an upper composite layer of CoFe(10%)—NiFe(60%) separated by a coupling layer of Ru, wherein the upper composite layer is adjacent to the tunnel barrier layer.

6. The device of claim 4 wherein the lower layer of CoFe is between approximately 18 and 25 angstroms thick, the upper layer of CoFe is between approximately 15 to 20 angstroms thick and the Ru layer is 7 to 8 angstroms thick.

7. The device of claim 5 wherein the lower layer of CoFe is between approximately 18 and 25 angstroms thick, the upper composite layer of CoFe(10%)—NiFe(60%) is between approximately 5 and 10 angstroms thick, giving said composite layer a total magnetic thickness equivalent to 15 to 20 angstroms of CoFe(25%) and the Ru layer is 7 to 8 angstroms thick.

8. The device of claim 1 wherein the oxygen surfactant layer is less than a monolayer of oxygen adsorbed on the surface of said upper ferromagnetic layer.

9. The device of claim 4 wherein said upper ferromagnetic layer is CoFe(25%) and wherein the oxygen in said oxygen surfactant layer formed on said CoFe(25%) has been incorporated into said tunnel barrier layer.

10. The device of claim 5 wherein said upper ferromagnetic layer is a composite layer of CoFe(10%)—NiFe(60%) and wherein the oxygen in said oxygen surfactant layer has been incorporated into said tunnel barrier layer.

11. The device of claim 1 wherein the tunneling barrier layer is a layer of oxidized Al, formed by PVD deposition on an oxygen surfactant layer to a thickness between approximately 7 and 10 angstroms and oxidized by radical oxidation to a homogeneous $Al_2O_3$ stoichiometry.

12. The device of claim 1 wherein the ferromagnetic free layer is a bilayer of CoFe(25%)—NiFe(20%) in which the CoFe(25%) is formed to a thickness between approximately 5 and 10 angstroms and the NiFe(20%) is formed to a thickness between approximately 25 and 50 angstroms.

13. The device of claim 1 wherein the ferromagnetic free layer is a bilayer of NiFe(60%)—NiFe(20%) in which the NiFe(60%) is formed to a thickness between approximately 5 and 10 angstroms and the NiFe(20%) is formed to a thickness between approximately 25 and 50 angstroms.

* * * * *